(12) United States Patent
Jangjian et al.

(10) Patent No.: US 9,502,538 B2
(45) Date of Patent: Nov. 22, 2016

(54) STRUCTURE AND FORMATION METHOD OF FIN-LIKE FIELD EFFECT TRANSISTOR

(71) Applicant: Taiwan Semiconductor Manufacturing Co., Ltd, Hsin-Chu (TW)

(72) Inventors: Shiu-Ko Jangjian, Tainan (TW); Tzu-Kai Lin, Tainan (TW); Chi-Cherng Jeng, Tainan (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/483,900

(22) Filed: Sep. 11, 2014

(65) Prior Publication Data

US 2015/0364579 A1    Dec. 17, 2015

Related U.S. Application Data

(60) Provisional application No. 62/011,386, filed on Jun. 12, 2014.

(51) Int. Cl.
| | |
|---|---|
| *H01L 29/66* | (2006.01) |
| *H01L 29/78* | (2006.01) |
| *H01L 21/8238* | (2006.01) |
| *H01L 27/092* | (2006.01) |

(52) U.S. Cl.
CPC . *H01L 29/66795* (2013.01); *H01L 21/823814* (2013.01); *H01L 21/823821* (2013.01); *H01L 27/0924* (2013.01); *H01L 29/785* (2013.01)

(58) Field of Classification Search
CPC ............ H01L 29/66795; H01L 29/785; H01L 21/823814; H01L 21/823821; H01L 27/0924

See application file for complete search history.

(56) References Cited

U.S. PATENT DOCUMENTS

| | | | |
|---|---|---|---|
| 7,235,468 | B1 | 6/2007 | Mouli |
| 2005/0218438 | A1 | 10/2005 | Lindert et al. |
| 2005/0224800 | A1 | 10/2005 | Lindert et al. |
| 2005/0280090 | A1 | 12/2005 | Anderson et al. |
| 2006/0065927 | A1 | 3/2006 | Thean et al. |
| 2009/0020820 | A1 | 1/2009 | Baik et al. |
| 2013/0200455 | A1 | 8/2013 | Lo et al. |
| 2014/0073096 | A1 | 3/2014 | Chung et al. |

FOREIGN PATENT DOCUMENTS

| | | |
|---|---|---|
| JP | 2007-511077 A | 4/2007 |
| JP | 2012-190896 A | 10/2012 |
| KR | 10-2006-0130704 A | 12/2006 |

(Continued)

*Primary Examiner* — Long Pham
(74) *Attorney, Agent, or Firm* — Haynes and Boone, LLP

(57) ABSTRACT

A structure and a formation method of a semiconductor device are provided. The semiconductor device includes a semiconductor substrate and a fin structure over the semiconductor substrate. The semiconductor device also includes a gate stack covering a portion of the fin structure and an epitaxially grown source/drain structure over the fin structure and adjacent to the gate stack. The semiconductor device further includes a semiconductor protection layer over the epitaxially grown source/drain structure. The semiconductor protection layer has an atomic concentration of carbon greater than that of the epitaxially grown source/drain structure.

20 Claims, 15 Drawing Sheets

(56) References Cited

FOREIGN PATENT DOCUMENTS

| KR | 10-2007-0061565 A | 6/2007 |
|----|-------------------|--------|
| KR | 10-2013-0091620 A | 8/2013 |
| TW | 201126614 A1 | 8/2011 |
| TW | 201312751 A1 | 3/2013 |
| TW | 201401508 A | 1/2014 |
| TW | 201405668 A | 2/2014 |
| TW | 201407786 A | 2/2014 |
| TW | 201417297 A | 5/2014 |
| TW | 201419545 A | 5/2014 |

STRUCTURE AND FORMATION METHOD OF FIN-LIKE FIELD EFFECT TRANSISTOR

PRIORITY CLAIM AND CROSS-REFERENCE

This Application claims the benefit of U.S. Provisional Application No. 62/011,386, filed on Jun. 12, 2014, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. The scaling-down process generally provides benefits by increasing production efficiency and lowering associated costs.

Despite groundbreaking advances in materials and fabrication, scaling planar devices such as the metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Advantages of the FinFET may include a reduction of the short channel effect, reduced leakage, and higher current flow.

However, since feature sizes continue to decrease, fabrication processes continue to become more difficult to perform. Therefore, it is a challenge to form a reliable semiconductor device including the FinFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-9A are cross-sectional views of various stages of a process for forming a semiconductor device, in accordance with some embodiments.

FIGS. 2B-9B are cross-sectional views of various stages of a process for forming a semiconductor device, in accordance with some embodiments.

DETAILED DESCRIPTION

Figure 1A:
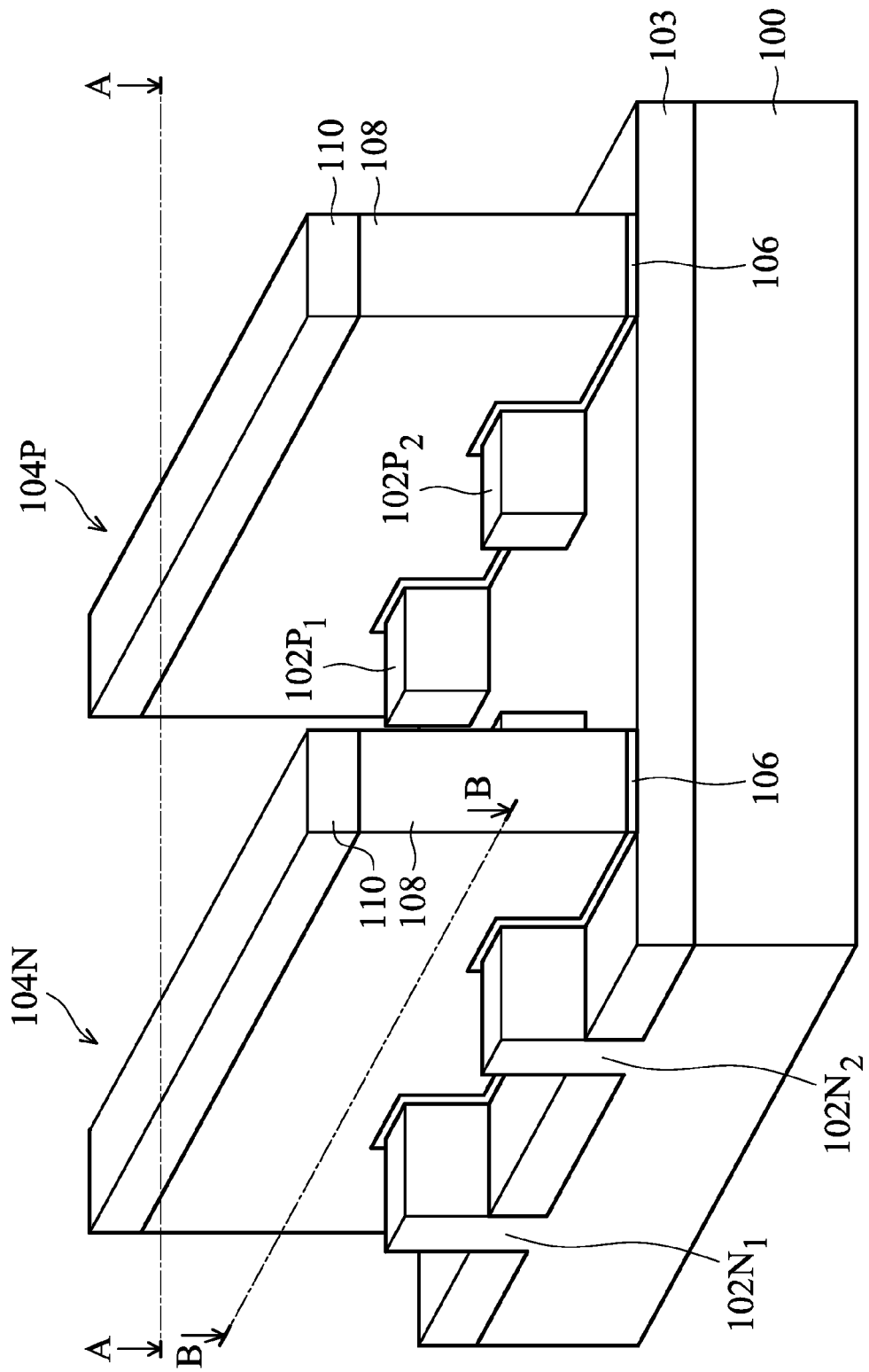
FIGS. 1A-1F are perspective views of various stages of a process for forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1F are perspective views of various stages of a process for forming a semiconductor device, in accordance with some embodiments. Additional operations can be provided before, during, and/or after the stages described in FIGS. 1A-1F. FIGS. 2A-9A are cross-sectional views of various stages of a process for forming a semiconductor device, in accordance with some embodiments. For example, FIGS. 2A-9A are cross-sectional views taken along the line A-A in FIGS. 1A-1F. FIGS. 2B-9B are cross-sectional views of various stages of a process for forming a semiconductor device, in accordance with some embodiments. For example, FIGS. 2B-9B are cross-sectional views taken along the line B-B in FIGS. 1A-1F. Some of the stages described can be replaced or eliminated for different embodiments. Additional features can be added in the semiconductor device. Some of the features described below can be replaced or eliminated for different embodiments.

Figure 2A:
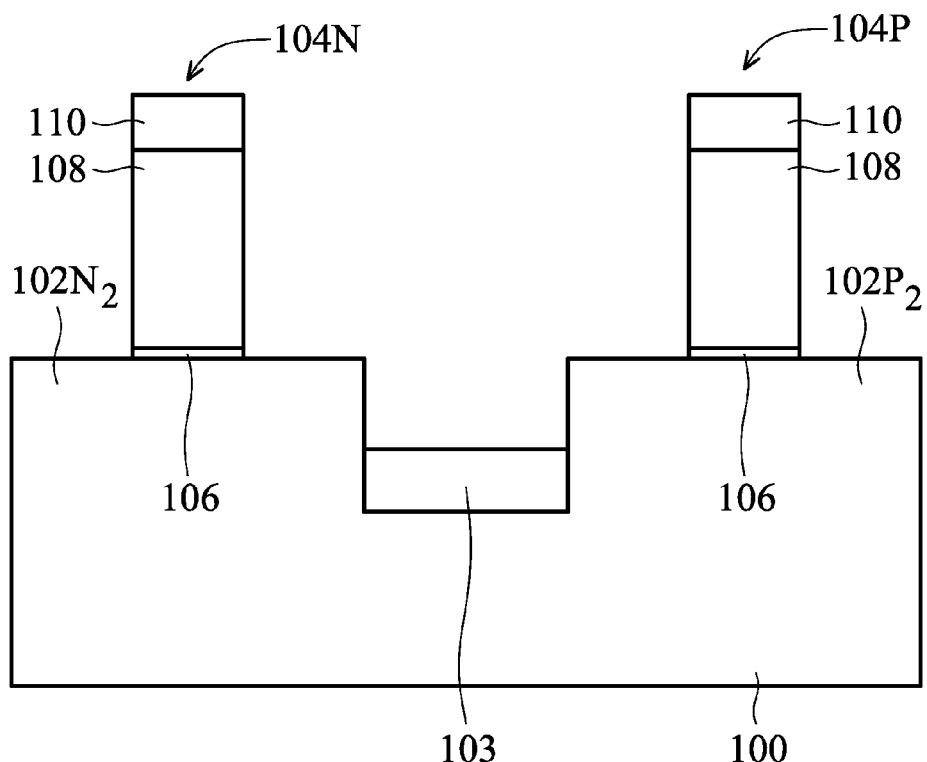
Figure 2B:
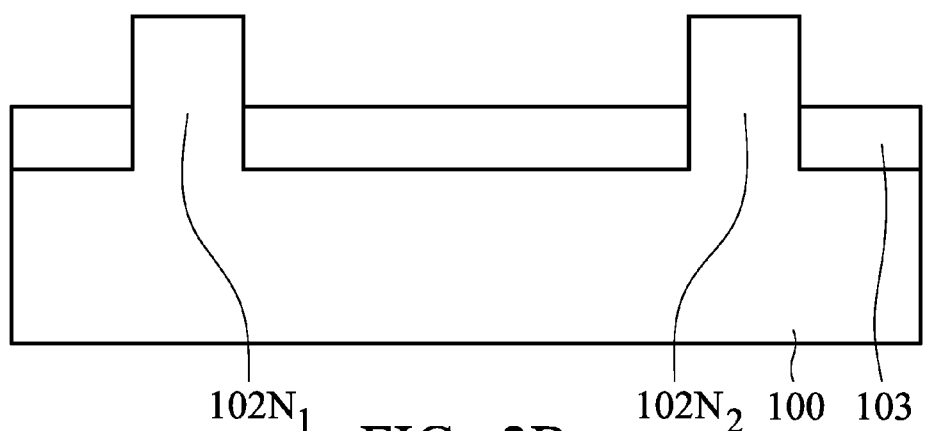

As shown in FIGS. 1A, 2A, and 2B, a semiconductor substrate 100 is provided. In some embodiments, the semiconductor substrate 100 is a bulk semiconductor substrate. The bulk semiconductor substrate may be a semiconductor wafer such as a silicon wafer. In some embodiments, the semiconductor substrate 100 includes an elementary semiconductor material such as silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof.

In some embodiments, the semiconductor substrate 100 is a semiconductor-on-insulator (SOI) substrate. The SOI substrate may be fabricated by using a separation by implantation of oxygen (SIMOX) process, a wafer bonding process, another applicable method, or a combination thereof.

In some embodiments, the semiconductor substrate 100 includes various doped regions (not shown) depending on design requirements of the semiconductor device. The doped regions include, for example, p-type wells and/or n-type wells. In some embodiments, the doped regions are doped with p-type dopants. For example, the doped regions are doped with boron or $BF_2$. In some embodiments, the doped regions are doped with n-type dopants. For example, the doped regions are doped with phosphor or arsenic. In some embodiments, some of the doped regions are p-type doped, and the other doped regions are n-type doped.

Afterwards, one or more fin structures are formed over the semiconductor substrate 100. As shown in FIGS. 1A, 2A, and 2B, fin structures $102N_1$, $102N_2$, $102P_1$, and $102P_2$ are formed, in accordance with some embodiments. In some embodiments, the fin structures $102N_1$, $102N_2$, $102P_1$, and $102P_2$ are formed by etching into the semiconductor substrate 100. The semiconductor substrate 100 is partially removed to form recesses (or trenches). A photolithography process and an etching process may be used to form the recesses. As a result, the fin structures $102N_1$, $102N_2$, $102P_1$, and $102P_2$ are formed between the recesses.

As shown in FIGS. 1A, 2A, and 2B, one or more isolation features 103 are formed over the semiconductor substrate 100, in accordance with some embodiments. The isolation features 103 are used to define and electrically isolate various device elements formed in and/or over the semiconductor substrate 100. In some embodiments, the isolation features 103 surround lower portions of the fin structures $102N_1$, $102N_2$, $102P_1$, and $102P_2$. Upper portions of the fin structures $102N_1$, $102N_2$, $102P_1$, and $102P_2$ protrude from the top surfaces of the isolation features 103.

In some embodiments, the isolation features 103 include shallow trench isolation (STI) features, local oxidation of silicon (LOCOS) features, another suitable isolation features, or a combination thereof. In some embodiments, each of the isolation features 103 has a multi-layer structure. In some embodiments, the isolation features 103 are made of a dielectric material. The dielectric material may include silicon oxide, silicon nitride, silicon oxynitride, fluoride-doped silicate glass (FSG), low-K dielectric material, other suitable materials, or a combination thereof. In some embodiments, an STI liner (not shown) is formed to reduce crystalline defects at the interface between the semiconductor substrate 100 and the isolation features 103.

In some embodiments, a dielectric material layer is deposited over the semiconductor substrate 100. The dielectric material layer covers the fin structures $102N_1$, $102N_2$, $102P_1$, and $102P_2$. In some embodiments, the dielectric material layer is deposited using a chemical vapor deposition (CVD) process, a spin-on process, another applicable process, or a combination thereof. In some embodiments, a planarization process, such as a chemical mechanical polishing (CMP) process, is performed to thin down the dielectric material layer until the fin structures $102N_1$, $102N_2$, $102P_1$, and $102P_2$ are exposed. Afterwards, an etching process is performed to remove an upper portion of the dielectric material layer such that the fin structures $102N_1$, $102N_2$, $102P_1$, and $102P_2$ protrude from the remaining dielectric material layer. As a result, the isolation features 103 are formed. This also allows the fin structures $102N_1$, $102N_2$, $102P_1$, and $102P_2$ to be selectively processed in subsequent operations.

As shown in FIGS. 1A, 2A, and 2B, one or more gate stacks are formed over the semiconductor substrate 100 and the fin structures, in accordance with some embodiments. For example, gate stacks 104N and 104P are formed. Each of the gate stacks 104N and 104P includes a gate dielectric layer 106 and a gate electrode 108, in accordance with some embodiments. In some embodiments, each of the gate stacks 104N and 104P includes a hard mask 110. The hard mask 110 is used to assist in the formation of the gate stacks 104N and 104P. In some embodiments, the hard mask 110 is made of silicon oxide, silicon nitride, silicon oxynitride, silicon carbide, another suitable material, or a combination thereof. In some embodiments, the hard mask 110 has a multi-layer structure.

In some embodiments, the gate dielectric layer 106 is made of silicon oxide, silicon nitride, silicon oxynitride, dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 106 is a dummy gate dielectric layer which will be removed in a subsequent process. The dummy gate dielectric layer is, for example, a silicon oxide layer.

In some embodiments, the gate electrode 108 includes polysilicon, a metal material, another suitable conductive material, or a combination thereof. In some embodiments, the gate electrode 108 is a dummy gate electrode and will be replaced with another conductive material such as a metal material. The dummy gate electrode is made of, for example, polysilicon.

In some embodiments, a gate dielectric material and a gate electrode layer are deposited over the semiconductor substrate 100 and the fin structures $102N_1$, $102N_2$, $102P_1$, and $102P_2$. In some embodiments, the gate dielectric material and the gate electrode layer are sequentially deposited by using suitable deposition methods. The suitable deposition methods may include a chemical vapor deposition (CVD) process, an atomic layer deposition (ALD) process, a thermal oxidation process, a physical vapor deposition (PVD) process, another applicable process, or a combination thereof. Afterwards, with the assistance of the hard mask 110, the gate dielectric material and the gate electrode layer are patterned to form the gate stacks including the gate dielectric layer 106 and the gate electrode 108.

Figure 1B:
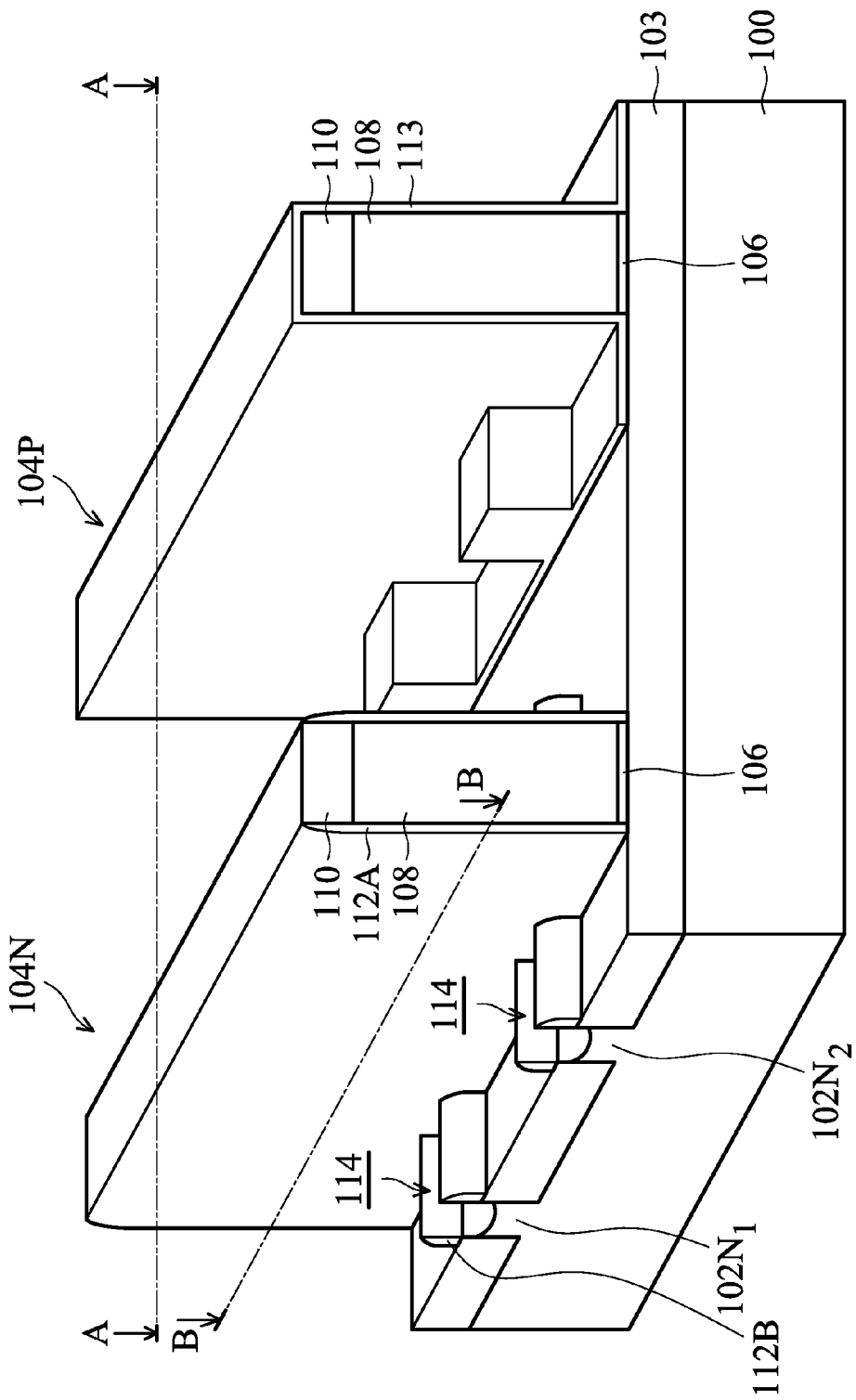
Figure 3A:
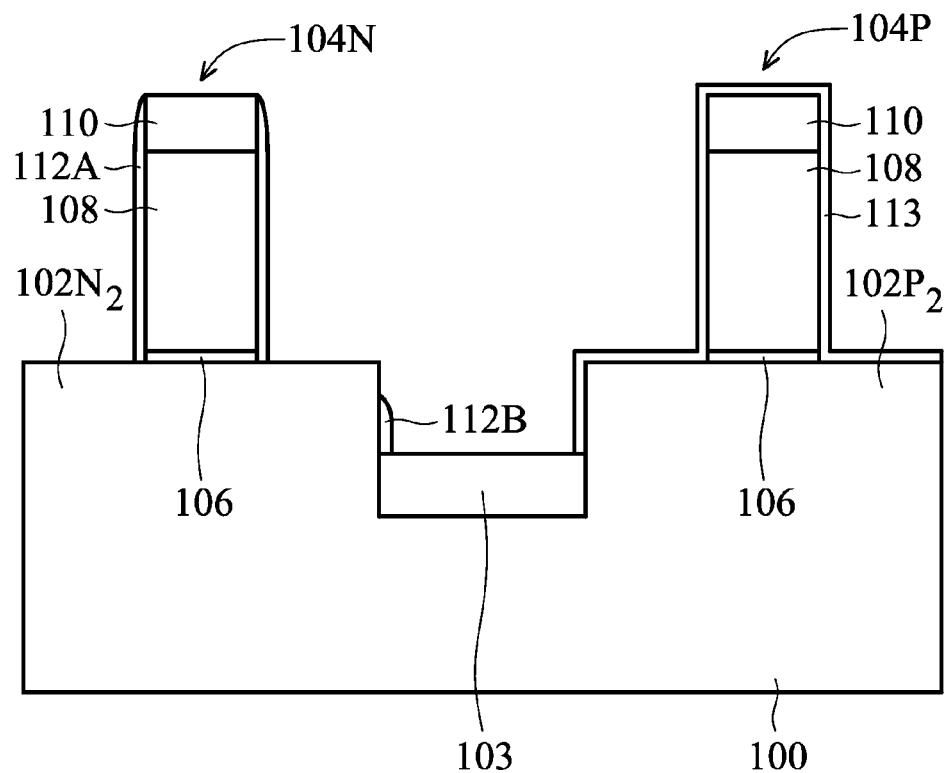
Figure 3B:
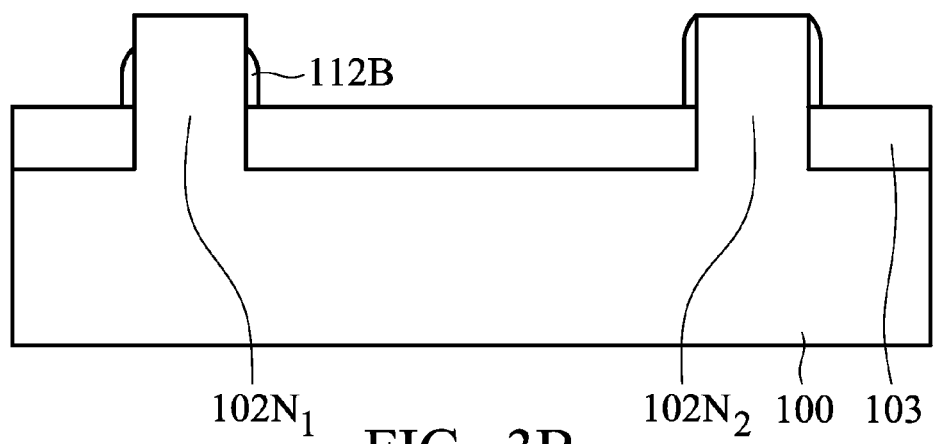

As shown in FIGS. 1B, 3A and 3B, a mask layer 113 is formed over the gate stack 104P and the fin structures $102P_1$ and $102P_2$, in accordance with some embodiments. Therefore, the gate stack 104P and the fin structures $102P_1$ and $102P_2$ are blocked and protected from being negatively affected during subsequent processes performed to the fin structures $102N_1$ and $102N_2$. In some embodiments, the mask layer 113 is made of a dielectric material. The dielectric material may include silicon nitride, silicon oxynitride, silicon carbide, another suitable dielectric material, or a combination thereof.

In some embodiments, a mask material layer is deposited over the semiconductor substrate 100, the fin structures $102N_1$, $102N_2$, $102P_1$, and $102P_2$, and the gate stacks 104N and 104P. The mask material layer may be deposited by using a chemical vapor deposition (CVD) process, a physical vapor deposition (PVD) process, a spin-on process, another applicable process, or a combination thereof. Afterwards, the mask material layer is partially removed by using a photolithography process and an etching process. For example, a patterned photoresist layer (not shown) is formed on the mask material layer. The portion of the mask material layer not covered by the photoresist layer is etched. As a result, the mask layer 113 is formed.

As shown in FIGS. 1B and 3A, spacer elements 112A are formed over sidewalls of the gate stack 104N, in accordance with some embodiments. The spacer elements 112A may be used to assist in the formation of source and drain structures (or regions) in subsequent processes. In some embodiments, the spacer elements 112A are made of silicon nitride, silicon oxynitride, silicon carbide, another suitable material, or a combination thereof.

In some embodiments, a spacer layer is deposited over the semiconductor substrate 100, the fin structures $102N_1$, $102N_2$, $102P_1$, and $102P_2$, and the gate stacks 104N and 104P. The spacer layer may be deposited using a CVD process, a PVD process, a spin-on process, another applicable process, or a combination thereof. Afterwards, an etching process, such as an anisotropic etching process, is performed to partially remove the spacer layer. As a result, the remaining portions of the spacer layer over the sidewalls of the gate stack 104N form the spacer elements 112A.

As shown in FIGS. 3A and 3B, support elements 112B are formed over sidewalls of the fin structures $102N_1$ and $102N_2$, in accordance with some embodiments. The support elements 112B may be used to assist in the growth of source and drain structures (or regions) in subsequent processes. In some embodiments, the support elements 112B are made of silicon nitride, silicon oxynitride, silicon carbide, another suitable material, or a combination thereof.

In some embodiments, a material layer is deposited over the semiconductor substrate 100, the fin structures $102N_1$, $102N_2$, $102P_1$, and $102P_2$, and the gate stacks 104N and 104P. The material layer may be deposited using a CVD process, a PVD process, a spin-on process, another applicable process, or a combination thereof. Afterwards, an etching process, such as an anisotropic etching process, is performed to partially remove the material layer. As a result, the remaining portions of the material layer over the sidewalls of the fin structures $102N_1$ and $102N_2$ form the support elements 112B.

In some embodiments, the mask layer 113, the spacer elements 112A, and the support elements 112B are portions of the same dielectric layer. In some embodiments, a dielectric layer is deposited over the semiconductor substrate 100, the fin structures $102N_1$, $102N_2$, $102P_1$, and $102P_2$, and the gate stacks 104N and 104P. In some embodiments, the dielectric layer is deposited using a CVD process, a PVD process, a spin-on process, another applicable process, or a combination thereof. In some embodiments, the dielectric layer includes multiple sub-layers.

Afterwards, a patterned photoresist layer (not shown) is formed over the portion of dielectric layer on the gate stack 104P and the fin structures $102P_1$ and $102P_2$. An anisotropic etching process is then performed to etch back the portion of the dielectric layer not covered by the photoresist layer. As a result, the remaining portions of the dielectric layer over the sidewalls of the gate stack 104N form the spacer elements 112A. The remaining portions of the dielectric layer over the sidewalls of the fin structures 102N1 and 102N2 form the support elements 112B. The remaining portion of the dielectric layer under the photoresist layer forms the mask layer 113. In these cases, the spacer elements 112A, the support elements 112B, and the mask layer 113 are made of the same material. In some embodiments, the photoresist layer is removed after the formation of the spacer elements 112A and the support elements 112B.

Embodiments of the disclosure have many variations and are not limited to the embodiments mentioned above. In some embodiments, the spacer elements 112A are not formed. In some other embodiments, the support elements 112B are not formed. In some other embodiments, neither the spacer elements 112A nor the support elements 112B are formed.

Figure 4A:
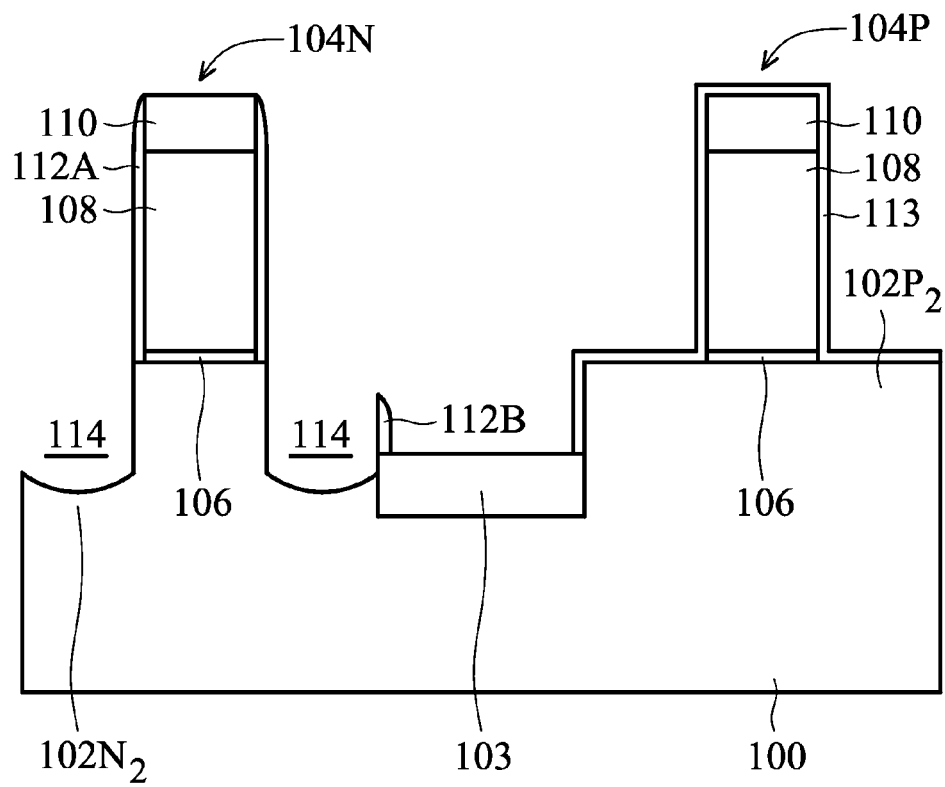
Figure 4B:
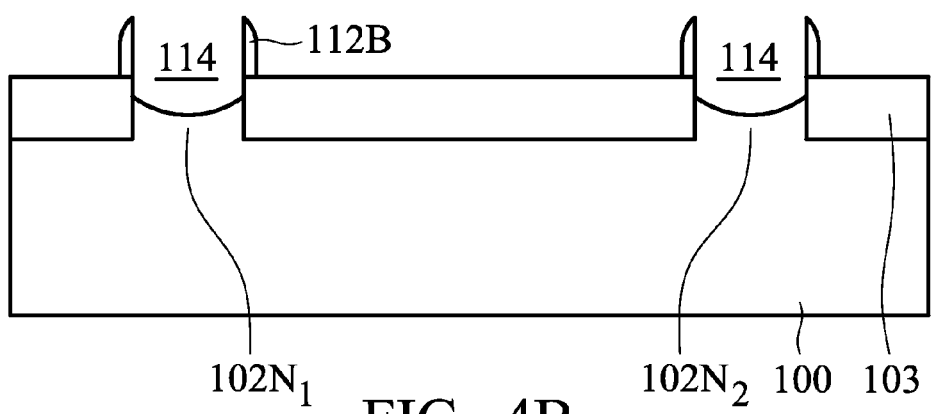

As shown in FIGS. 1B, 4A, and 4B, a portion of the fin structures $102N_1$ and $102N_2$ are removed to lower the fin structures $102N_1$ and $102N_2$ and form recesses 114, in accordance with some embodiments. During the recessing of the fin structures $102N_1$ and $102N_2$, the fin structures $102P_1$ and $102P_2$ are blocked or protected by the mask layer 113. Therefore, the fin structures $102P_1$ and $102P_2$ are prevented from being damaged.

In some embodiments, the fin structures $102N_1$ and $102N_2$ are recessed to a level below the tops of the support elements 112B. In some embodiments, the fin structures $102N_1$ and $102N_2$ are recessed to a level below the top surfaces of the isolation features 103. In some embodiments, an etching process is used to form the recesses 114. However, it should be appreciated that embodiments of the disclosure have many variations. In some other embodiments, the fin structures $102N_1$ and $102N_2$ are not partially removed to form the recesses 114.

Figure 1C:
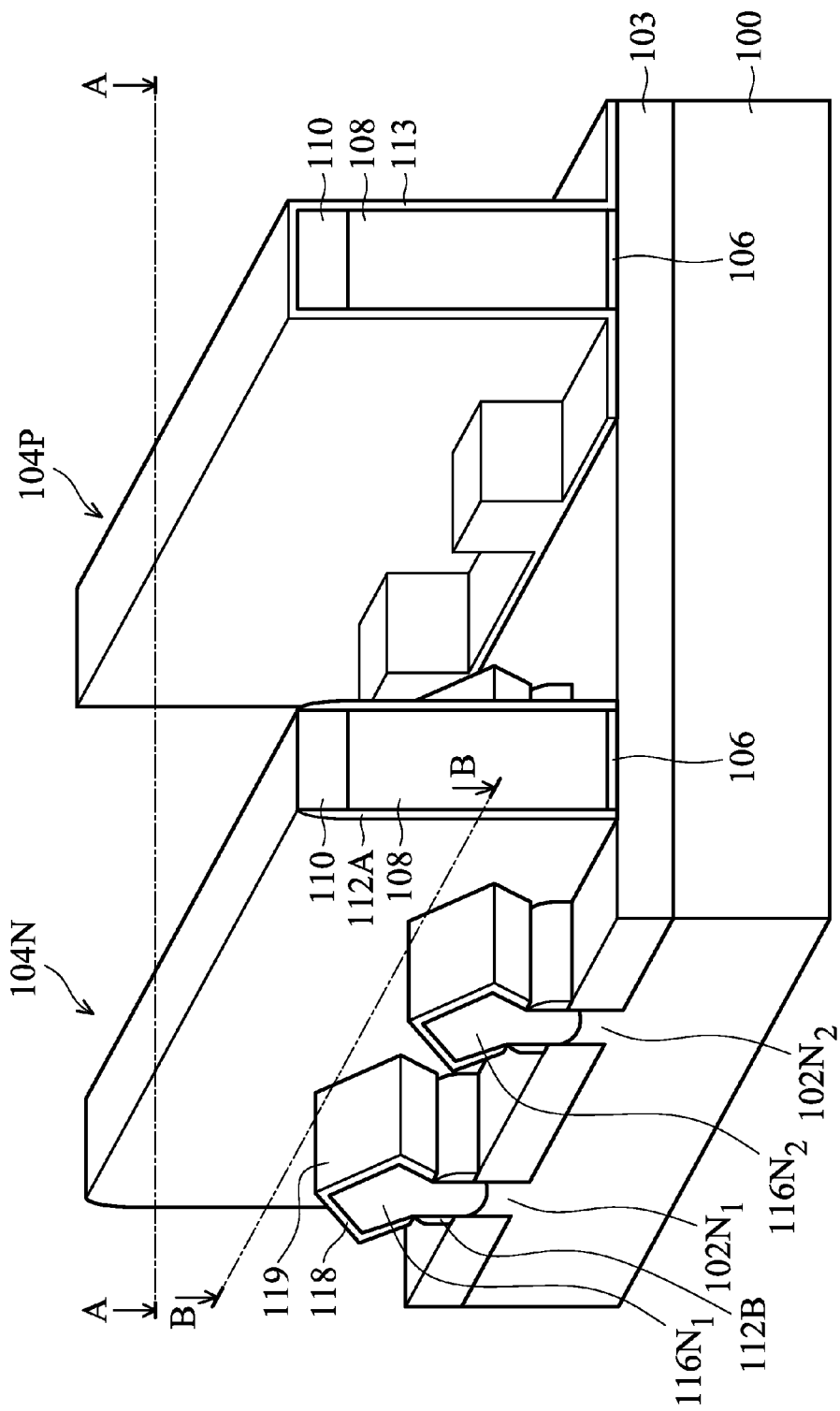
Figure 5A:
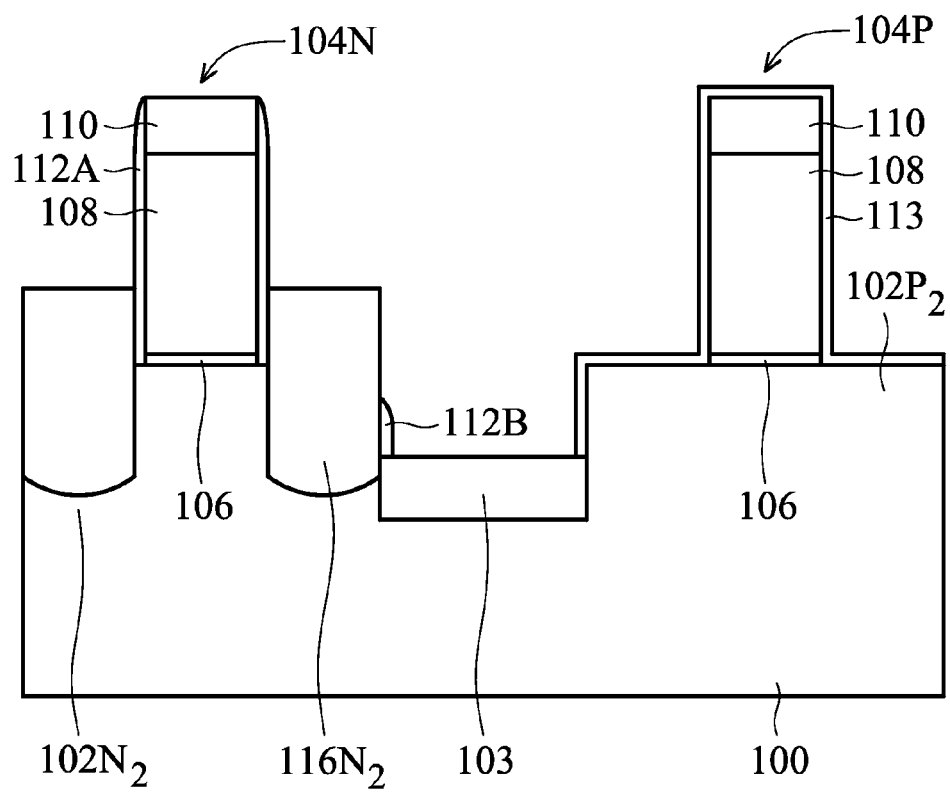
Figure 5B:
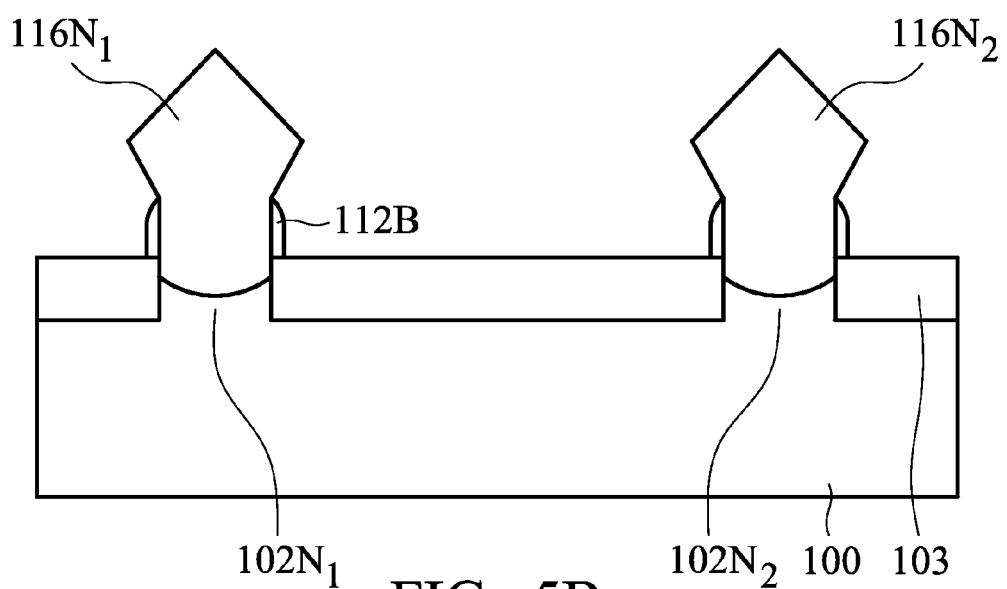

As shown in FIGS. 1C, 5A, and 5B, source/drain structures $116N_1$ and $116N_2$ are respectively formed over the fin structures $102N_1$ and $102N_2$, in accordance with some embodiments. In some embodiments, a semiconductor material is epitaxially grown in the recesses 114 and continues to grow to above the recesses 114 to form the source/drain structures $116N_1$ and $116N_2$. The support elements 112B may act as a template to control the growth of the source/drain structures $116N_1$ and $116N_2$. As shown in FIGS. 1C, 5A, and 5B, the support elements 112B cover lower portions of the source/drain structures $116N_1$ and $116N_2$. In some embodiments, the support elements 112B are in direct contact with the source/drain structures $116N_1$ and $116N_2$.

During the growth of the source/drain structures $116N_1$ and $116N_2$, the fin structures $102P_1$ and $102P_2$ are blocked or protected by the mask layer 113 in some embodiments. Therefore, the semiconductor material is prevented from being grown on the fin structures $102P_1$ and $102P_2$.

In some embodiments, the source/drain structures $116N_1$ and $116N_2$ protrude above the support elements 112B. The source/drain structures $116N_1$ and $116N_2$ may alternatively be referred to as raised source and drain features. In some embodiments, the source/drain structures $116N_1$ and $116N_2$ are strained structures. The source/drain structures $116N_1$ and $116N_2$ impart stress or strain to the channel region under the gate stack 104N to enhance the carrier mobility of the device and improve device performance.

In some embodiments, the source/drain structures $116N_1$ and $116N_2$ are an n-type semiconductor material. The source/drain structures $116N_1$ and $116N_2$ may include epitaxially grown silicon, epitaxially grown silicon phosphide (SiP), or another suitable epitaxially grown semiconductor material. The source/drain structures $116N_1$ and $116N_2$ are not limited to being an n-type semiconductor material. In some other embodiments, the source/drain structures $116N_1$ and $116N_2$ are a p-type semiconductor material. For example, the structures $116N_1$ and $116N_2$ may include epitaxially grown silicon germanium.

In some embodiments, the source/drain structures $116N_1$ and $116N_2$ are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. The formation process of the source/drain structures $116N_1$ and $116N_2$ may use gaseous and/or liquid precursors, which may interact with the composition of the fin structures $102N_2$ and $102N_1$ thereunder.

In some embodiments, the source/drain structures $116N_1$ and $116N_2$ are doped with one or more suitable dopants. For example, the source/drain structures $116N_1$ and $116N_2$ are Si source/drain features doped with phosphor (P), antimony (Sb), or another suitable dopant. Alternatively, the source/drain structures $116N_1$ and $116N_2$ are SiGe source/drain features doped with boron (B) or another suitable dopant.

In some embodiments, the source/drain structures $116N_1$ and $116N_2$ are doped in-situ during the growth of the source/drain structures $116N_1$ and $116N_2$. In some other embodiments, the source/drain structures $116N_1$ and $116N_2$ are not doped during the growth of the source/drain structures $116N1$ and $116N_2$. After the formation of the source/drain structures $116N_1$ and $116N_2$, the source/drain structures $116N_1$ and $116N_2$ are doped in a subsequent process. In some embodiments, the doping is achieved by using an ion implantation process, a plasma immersion ion implantation process, a gas and/or solid source diffusion process, another applicable process, or a combination thereof. In some embodiments, the source/drain structures $116N_1$ and $116N_2$ are further exposed to annealing processes to activate the dopants. For example, a rapid thermal annealing process is performed.

Figure 6A:
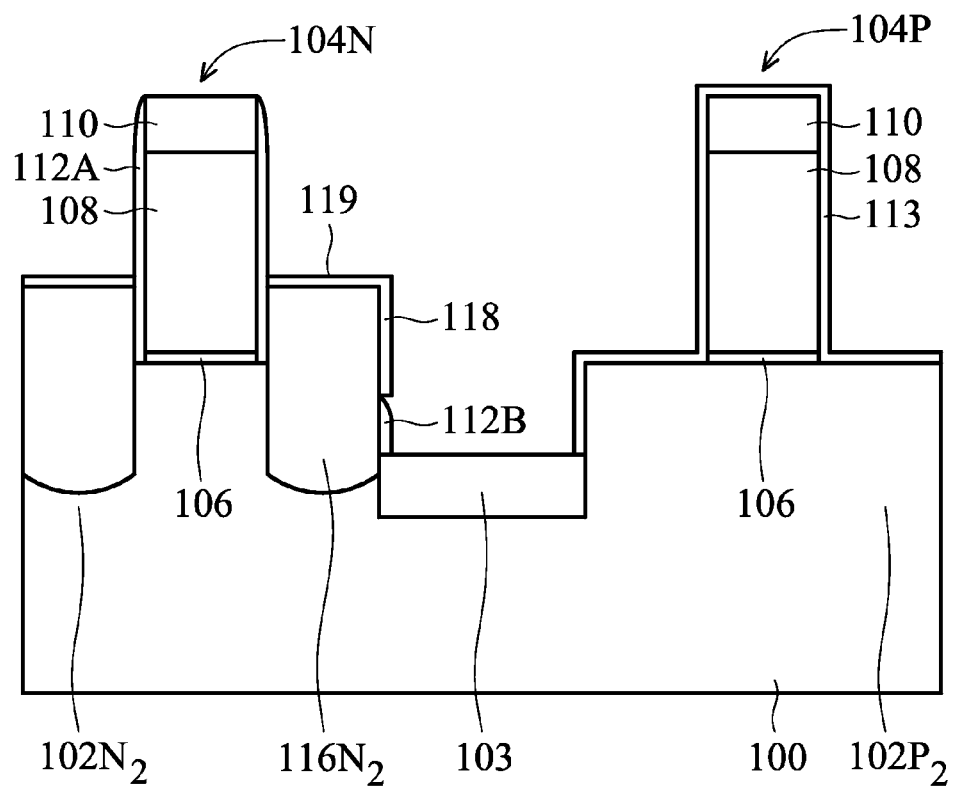
Figure 6B:
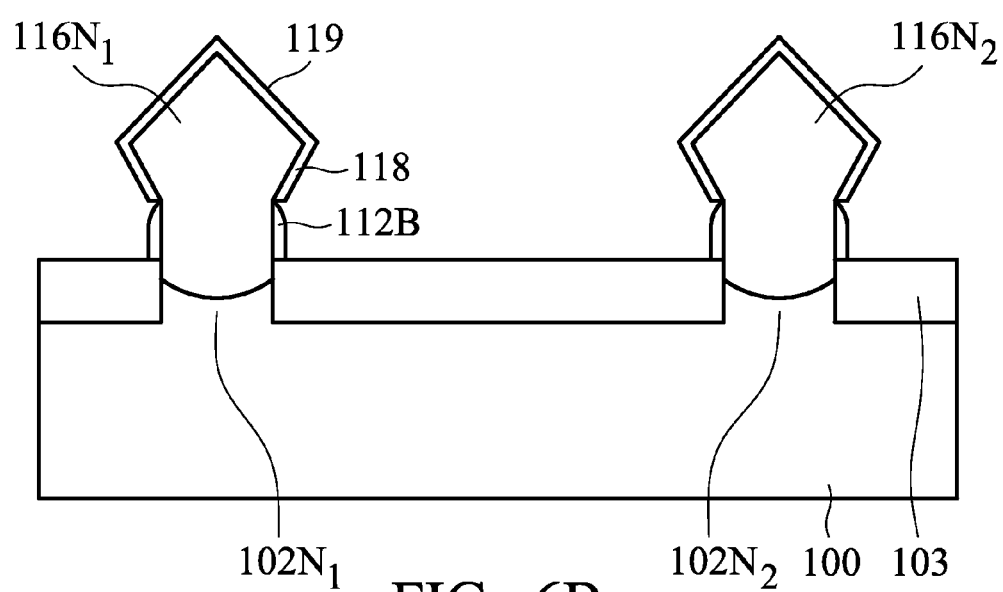

As shown in FIGS. 1C, 6A, and 6B, a semiconductor protection layer 118 is formed over the source/drain structures $116N_1$ and $116N_2$, in accordance with some embodiments. The semiconductor protection layer 118 is used to protect the source/drain structures $116N_1$ and $116N_2$ from damage during subsequent processes such as cleaning processes and/or etching processes. Therefore, the sizes or morphology of the source/drain structures $116N_1$ and $116N_2$ could be maintained after the subsequent cleaning processes and/or etching processes. The performance and reliability of the semiconductor device are improved.

In some embodiments, the semiconductor protection layer 118 includes carbon. In some embodiments, the semiconductor protection layer 118 has an atomic concentration of carbon greater than that of the source/drain structures $116N_1$ or $116N_2$. In some other embodiments, the atomic concentration of carbon is in a range from about 1% to about 10%. In some other embodiments, the atomic concentration of carbon is in a range from about 1.5% to about 4%. In some cases, if the atomic concentration of carbon is less than about 1%, the semiconductor protection layer 118 might not be able to sustain the subsequent cleaning processes and/or etching processes. As a result, the source/drain structures $116N_1$ or $116N_2$ thereunder may be damaged.

In some embodiments, the semiconductor protection layer 118 has a varying or gradient concentration profile. In some embodiments, the atomic concentration of carbon in the semiconductor protection layer 118 gradually decreases along a direction from a surface 119 of the semiconductor protection layer 118 towards the source/drain structures $116N_1$ or $116N_2$.

In some embodiments, the source/drain structures $116N_1$ or $116N_2$ are an n-type semiconductor material. In these cases, the semiconductor protection layer 118 may include a silicon layer doped with carbon or a germanium layer doped with carbon. In some embodiments, the source/drain structures $116N_1$ or $116N_2$ are a p-type semiconductor material. In these cases, the semiconductor protection layer 118 may include a silicon germanium layer doped with carbon.

The thickness of the semiconductor protection layer 118 should be finely controlled. In some embodiments, the semiconductor protection layer 118 has a thickness in a range from about 2 nm to about 10 nm. In some cases, if the thickness of the semiconductor protection layer 118 is smaller than about 2 nm, the semiconductor protection layer 118 might not be able to prevent the source/drain structures $116N_1$ and $116N_2$ from being damaged by the subsequent cleaning processes and/or etching processes. In some other cases, if the thickness of the semiconductor protection layer 118 is greater than about 10 nm, the electrical quality of the semiconductor device might be negatively affected.

However, it should be appreciated that embodiments of the disclosure are not limited to the embodiments mentioned above. In some other embodiments, the semiconductor protection layer 118 has a thickness in a range from about 0.5 nm to about 15 nm.

In some embodiments, the semiconductor protection layer 118 is epitaxially grown on the source/drain structures $116N_1$ and $116N_2$. Therefore, the semiconductor protection layer 118 is in direct contact with the source/drain structures $116N_1$ and $116N_2$. In some embodiments, the semiconductor protection layer 118 covers the exposed surfaces of the source/drain structures $116N_1$ and $116N_2$. In some embodiments, the semiconductor protection layer 118 does not cover the lower portions of the source/drain structures $116N_1$ and $116N_2$ which have been covered by the support elements 112B.

In some embodiments, the semiconductor protection layer 118 is formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. The formation process of the semiconductor protection layer 118 may use gaseous and/or liquid precursors, which may interact with the composition of the source/drain structures $116N_1$ and $116N_2$ thereunder. The precursor used for forming the semiconductor protection layer 118 may include $SiH_2Cl_2$, $SiH_4$, $Si_2H_6$, $Si_3H_8$, $GeH_4$, $SiH_3CH_3$, another suitable precursor, or a combination thereof. By fine-tuning the parameters of the process, the composition of the semiconductor protection layer 118 may be varied to meet requirements.

Figure 10:
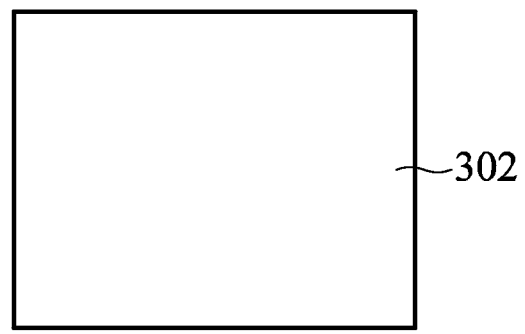
FIG. 10 is a cross-sectional view of a process chamber, in accordance with some embodiments.

In some embodiments, the source/drain structures $116N_1$ and $116N_2$ and the semiconductor protection layer 118 are formed in-situ in the same process chamber. FIG. 10 is a cross-sectional view of a process chamber 302, in accordance with some embodiments. In some embodiments, both the source/drain structures $116N_1$ and $116N_2$ and the semiconductor protection layer 118 are formed in the process chamber 302. In some embodiments, the structure shown in FIG. 1B is transferred into the process chamber 302 for forming the source/drain structures $116N_1$ and $116N_2$. After the formation of the source/drain structures $116N_1$ and $116N_2$, the semiconductor substrate 100 is not taken out of the process chamber 302. One or more parameters (such as the precursor gas) of the process are then varied to directly grow the semiconductor protection layer 118 on the exposed surfaces of the source/drain structures $116N_1$ and $116N_2$.

Figure 1D:
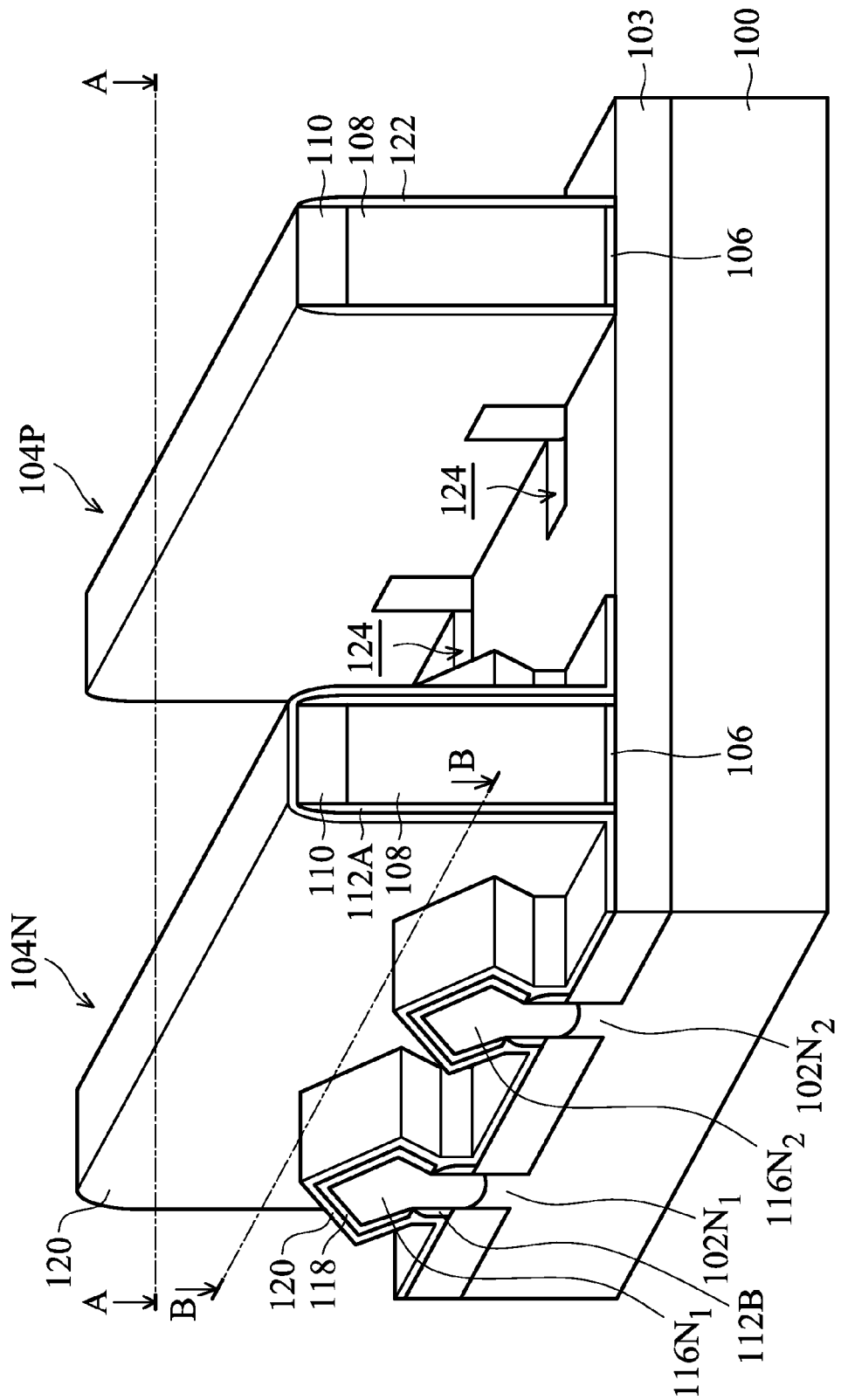
Figure 7A:
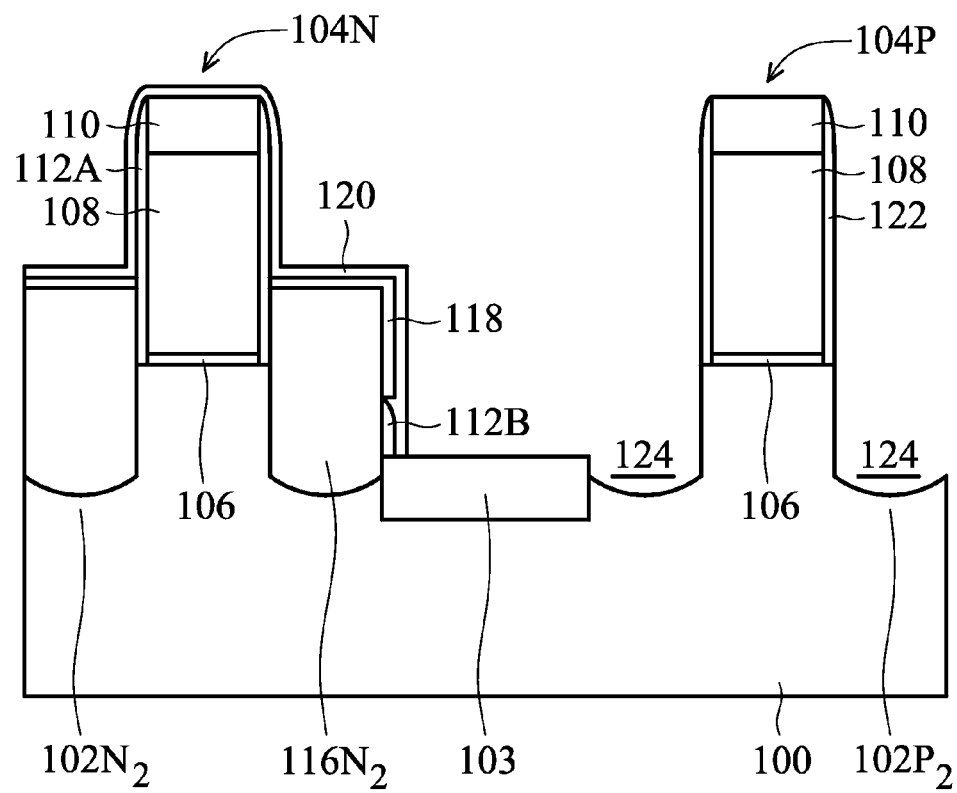
Figure 7B:
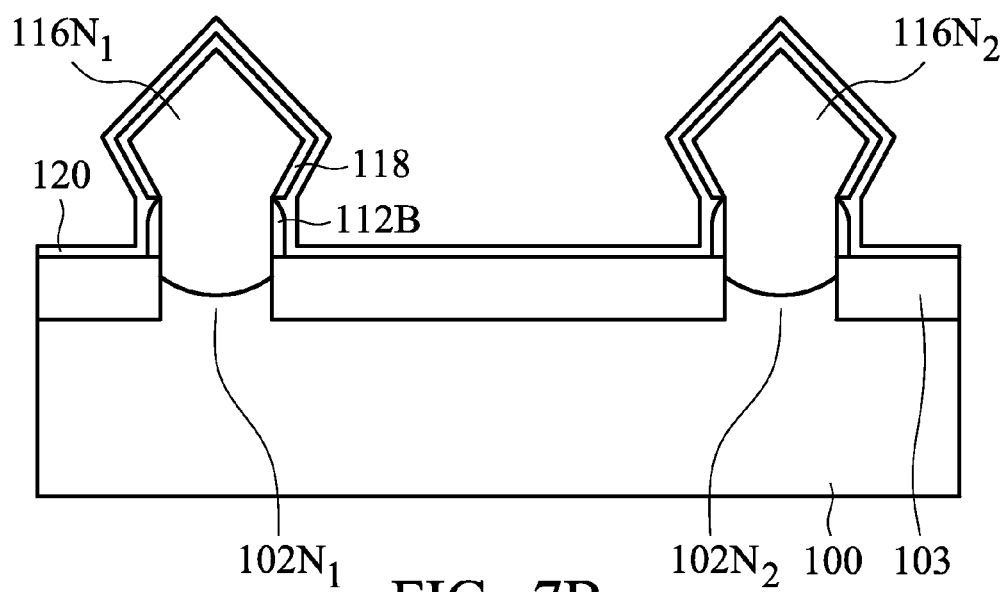

As shown in FIGS. 1D, 7A, and 7B, a mask layer 120 is formed over the gate stack 104N, the semiconductor protection layer 118, and the support elements 112B, in accordance with some embodiments. The mask layer 120 has an opening which exposes the mask layer 113 over the gate stack 104P and the fin structures $102P_1$ and $102P_2$. Therefore, the gate stack 104N and the semiconductor protection layer 118 are blocked and protected from being negatively affected during subsequent processes performed on the fin structures 102P₁ and 102P₂. In some embodiments, the mask layer 120 is made of a dielectric material. The dielectric material may include silicon nitride, silicon oxynitride, silicon carbide, another suitable dielectric material, or a combination thereof. The mask layer 120 may be formed by using a method similar to that used for forming the mask layer 113.

Afterwards, as shown in FIGS. 1D and 7A, spacer elements 122 are formed over sidewalls of the gate stack 104P, in accordance with some embodiments. The material and formation method of the spacer elements 122 may be similar to those of the spacer elements 112A. For example, a photoresist layer (not shown) is used to pattern the mask layer 120. The patterned mask layer 120 has an opening which exposes the mask layer 113 (see FIG. 1C or 6A). In some embodiments, an anisotropic etching process is performed to partially remove the exposed mask layer 113. As a result, the spacer elements 122 are formed. In some embodiments, due to the photoresist layer, the mask layer 120 is not etched during the formation of the spacer elements 122, as shown in FIG. 7B. Afterwards, the photoresist layer is removed in some embodiments.

In some embodiments, the portion of the mask layer 113 originally positioned over the sidewalls of the fin structures 102P₁ and 102P₂ is removed after the formation of the spacer elements 122. There is no support element formed over the sidewalls of the fin structures 102P₁ and 102P₂. However, it should be appreciated that embodiments of the disclosure are not limited thereto. In some other embodiments, support elements similar to the support elements 112B are formed over the sidewalls of the fin structures 102P₁ and 102P₂.

As shown in FIGS. 1D and 7A, portions of the fin structures 102P₁ and 102P₂ are removed to lower the fin structures 102P₁ and 102P₂ and form recesses 124, in accordance with some embodiments. During the recessing of the fin structures 102P₁ and 102P₂, the semiconductor protection layer 118 over the source/drain structures 116N₁ and 116N₂ are blocked or protected by the mask layer 120, as shown in FIGS. 1D, 7A, and 7B. Therefore, the semiconductor protection layer 118 is prevented from being damaged.

In some embodiments, the fin structures 102P₁ and 102P₂ are recessed to a level below the tops of the isolation features 103. In some embodiments, an etching process is used to form the recesses 124. Embodiments of the disclosure have many variations. In some other embodiments, the fin structures 102P₁ and 102P₂ are not partially removed to form the recesses 124.

Figure 1E:
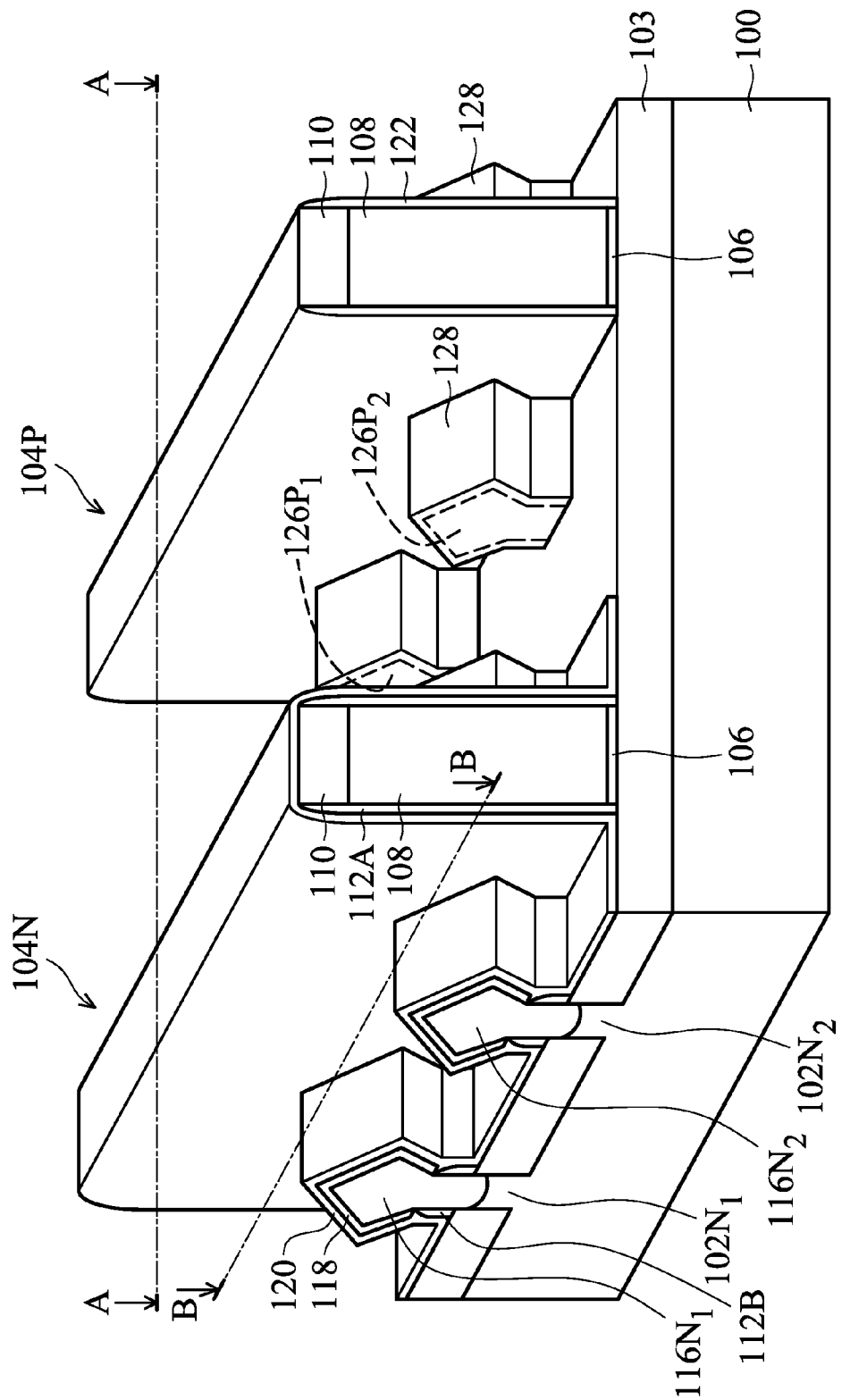
Figure 8A:
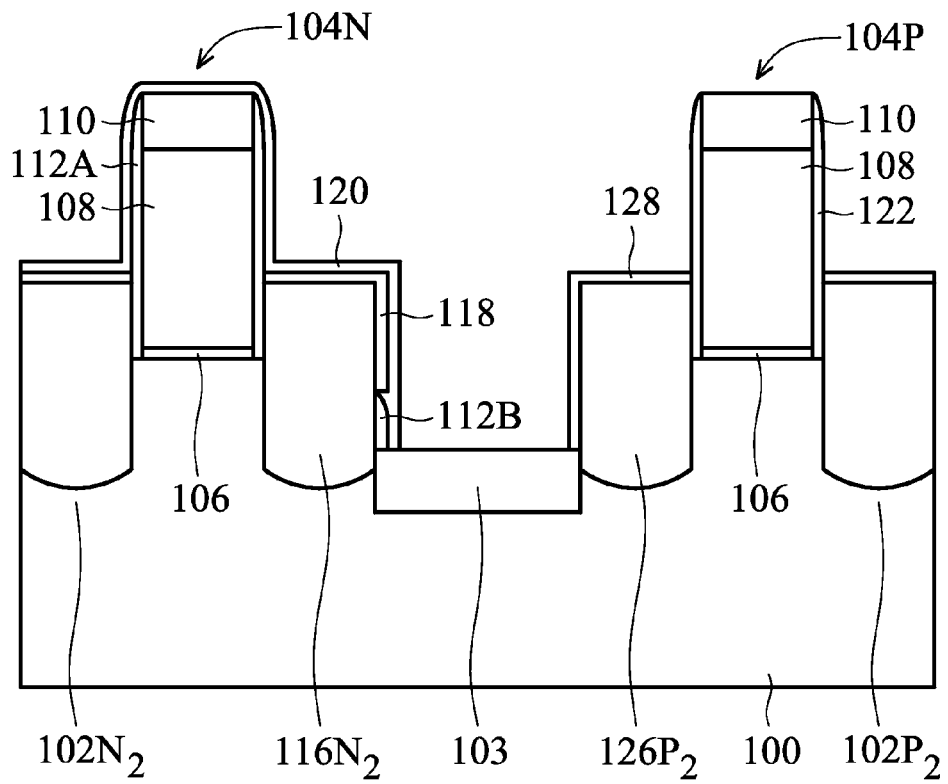

As shown in FIGS. 1E and 8A, source/drain structures 126P₁ and 126P₂ are formed respectively over the fin structures 102P₁ and 102P₂, in accordance with some embodiments. In some embodiments, a semiconductor material is epitaxially grown in and over the recesses 124 to form the source/drain structures 126P₁ and 126P₂. In some embodiments, no support element is used to assist in the growth of the source/drain structures 126P₁ and 126P₂. In some other embodiments, support elements are used.

During the growth of the source/drain structures 126P₁ and 126P₂, the semiconductor protection layer 118 is blocked or protected by the mask layer 120 in some embodiments. Therefore, the semiconductor material is prevented from being grown on the semiconductor protection layer 118.

In some embodiments, the source/drain structures 126P₁ and 126P₂ protrude above the isolation features 103. The source/drain structures 126P₁ and 126P₂ may alternatively be referred to as raised source and drain features. In some embodiments, the source/drain structures 126P₁ and 126P₂ are strained structures. The source/drain structures 126P₁ and 126P₂ impart stress or strain to the channel region under the gate stack 104P to enhance carrier mobility of the device and improve device performance.

In some embodiments, the source/drain structures 126P₁ and 126P₂ are a p-type semiconductor material. The source/drain structures 126P₁ and 126P₂ may include epitaxially grown silicon germanium. The source/drain structures 126P₁ and 126P₂ are not limited to being a p-type semiconductor material. In some other embodiments, the source/drain structures 126P₁ and 126P₂ are an n-type semiconductor material. For example, the structures 126P₁ and 126P₂ may include epitaxially grown silicon, epitaxially grown silicon phosphide (SiP), or another suitable epitaxially grown semiconductor material.

In some embodiments, the source/drain structures 126P₁ and 126P₂ are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. The formation process of the source/drain structures 126P₁ and 126P₂ may use gaseous and/or liquid precursors, which may interact with the composition of the fin structures 102P₂ and 102P₁ thereunder.

In some embodiments, the source/drain structures 126P₁ and 126P₂ are doped with one or more suitable dopants. For example, the source/drain structures 126P₁ and 126P₂ are SiGe source/drain features doped with boron (B) or another suitable dopant. Alternatively, the source/drain structures 126P₁ and 126P₂ are Si source/drain features doped with phosphor (P), antimony (Sb), or another suitable dopant.

In some embodiments, the source/drain structures 126P₁ and 126P₂ are doped in-situ during the growth of the source/drain structures 126P₁ and 126P₂. In some other embodiments, the source/drain structures 126P₁ and 126P₂ are not doped during the growth of the source/drain structures 126P₁ and 126P₂. After the formation of the source/drain structures 126P₁ and 126P₂, the source/drain structures 126P₁ and 126P₂ are doped in a subsequent process. In some embodiments, the doping is achieved by using an ion implantation process, a plasma immersion ion implantation process, a gas and/or solid source diffusion process, another applicable process, or a combination thereof. In some embodiments, the source/drain structures 126P₁ and 126P₂ are further exposed to annealing processes to activate the dopants. For example, a rapid thermal annealing process is performed.

Figure 8B:
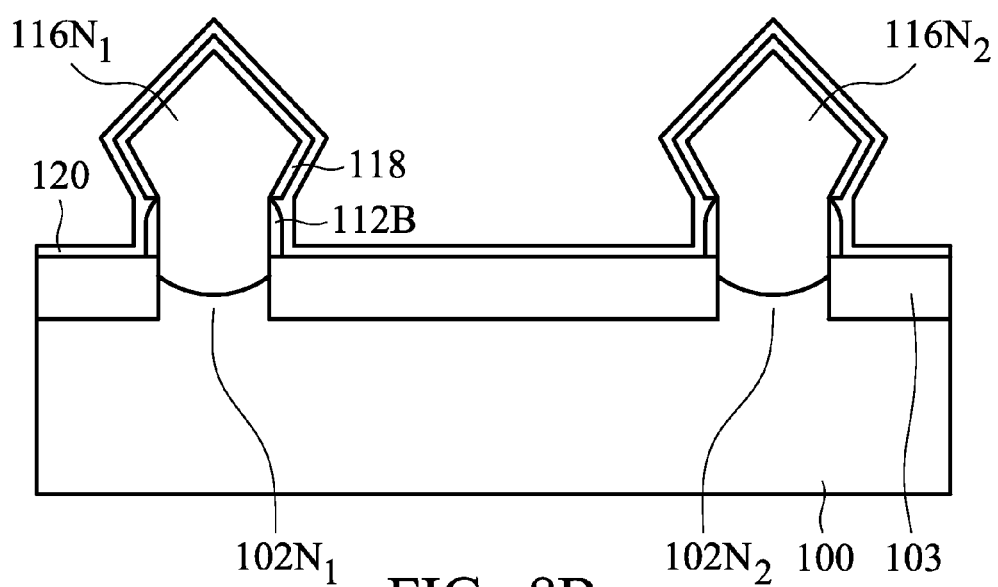

As shown in FIGS. 1E, 8A, and 8B, a semiconductor protection layer 128 is formed over the source/drain structures 126P₁ and 126P₂, in accordance with some embodiments. The semiconductor protection layer 128 is used to protect the source/drain structures 126P₁ and 126P₂ from being damaged during subsequent processes such as cleaning processes and/or etching processes. Therefore, the sizes or morphology of the source/drain structures 126P₁ and 126P₂ could be maintained after the subsequent cleaning processes and/or etching processes. The performance and reliability of the semiconductor device are improved.

In some embodiments, the semiconductor protection layer 128 covers a greater surface area of the source/drain structures 126P₁ and 126P₂ when compared with the semiconductor protection layer 118. In some other embodiments, support elements (not shown) are formed to assist in the formation of the source/drain structures 126P₁ and 126P₂. In these cases, both of the semiconductor protection layers 128 and 118 may cover similar surface areas of the corresponding source/drain structures.

In some embodiments, the semiconductor protection layer 128 includes carbon. In some embodiments, the semiconductor protection layer 128 is made of a material similar to that of the semiconductor protection layer 118. In some embodiments, the materials of the semiconductor protection layers 118 and 128 are the same. In some other embodiments, the materials of the semiconductor protection layers 118 and 128 are different. In some embodiments, the semiconductor protection layer 118 includes silicon and carbon. In some embodiments, the semiconductor protection layer 128 includes silicon, carbon, and germanium.

In some embodiments, the semiconductor protection layer 128 has a varying or gradient concentration profile. In some embodiments, the atomic concentration of carbon in the semiconductor protection layer 128 gradually decreases along a direction from a surface of the semiconductor protection layer 128 towards the source/drain structures 126P₁ or 126P₂.

The thickness of the semiconductor protection layer 128 should be finely controlled. In some embodiments, the semiconductor protection layer 128 has a thickness in a range from about 2 nm to about 10 nm. In some cases, if the thickness of the semiconductor protection layer 128 is less than about 2 nm, the semiconductor protection layer 128 might not be able to protect the source/drain structures 126P₁ and 126P₂ from being damaged by the subsequent cleaning processes and/or etching processes. In some other cases, if the thickness of the semiconductor protection layer 128 is greater than about 10 nm, the electrical quality of the semiconductor device might be negatively affected.

However, it should be appreciated that embodiments of the disclosure are not limited to the embodiments mentioned above. In some other embodiments, the semiconductor protection layer 128 has a thickness in a range from about 0.5 nm to about 15 nm.

In some embodiments, the semiconductor protection layer 128 is epitaxially grown on the source/drain structures 126P₁ and 126P₂. Therefore, the semiconductor protection layer 128 is in direct contact with the source/drain structures 126P₁ and 126P₂. In some embodiments, the semiconductor protection layer 128 covers the exposed surfaces of the source/drain structures 126P₁ and 126P₂. In some embodiments, the semiconductor protection layer 128 cover the lower portions of the source/drain structures 126P₁ and 126P₂ above the isolation features 103.

In some embodiments, the semiconductor protection layer 128 is formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. The formation process of the semiconductor protection layer 128 may use gaseous and/or liquid precursors, which may interact with the composition of the source/drain structures 126P₁ and 126P₂ thereunder. The precursor used for forming the semiconductor protection layer 128 may include $SiH_2Cl_2$, $SiH_4$, $Si_2H_6$, $Si_3H_8$, $GeH_4$, $SiH_3CH_3$, another suitable precursor, or a combination thereof. By fine-tuning the parameters of the process, the composition of the semiconductor protection layer 128 may be varied to meet requirements. In some embodiments, the source/drain structures 126P₁ and 126P₂ and the semiconductor protection layer 128 are formed in-situ in the same process chamber.

Figure 1F:
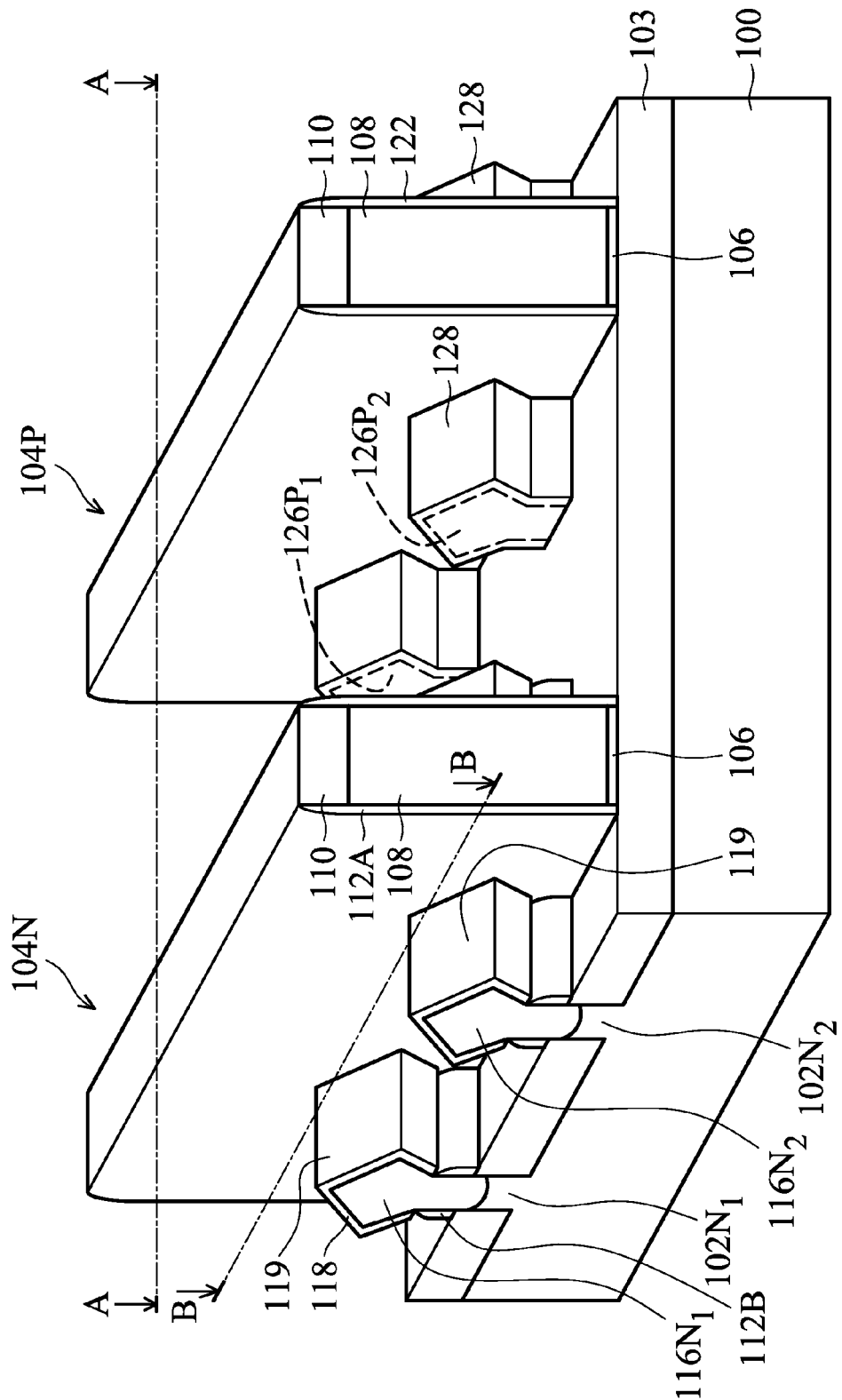
Figure 9A:
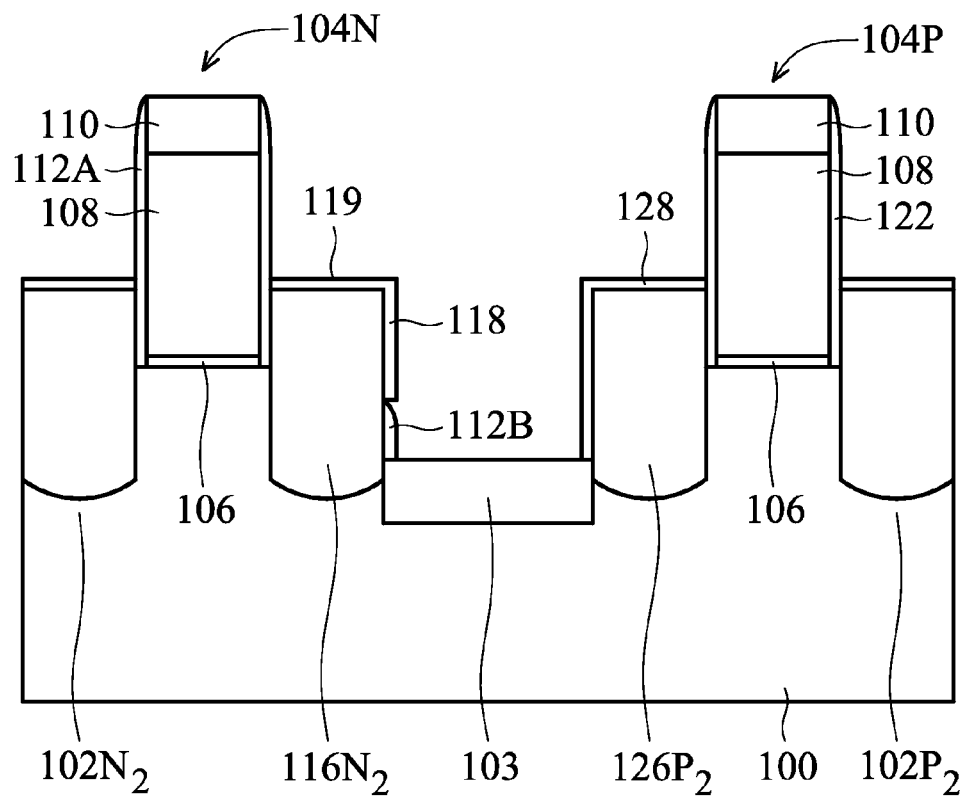
Figure 9B:
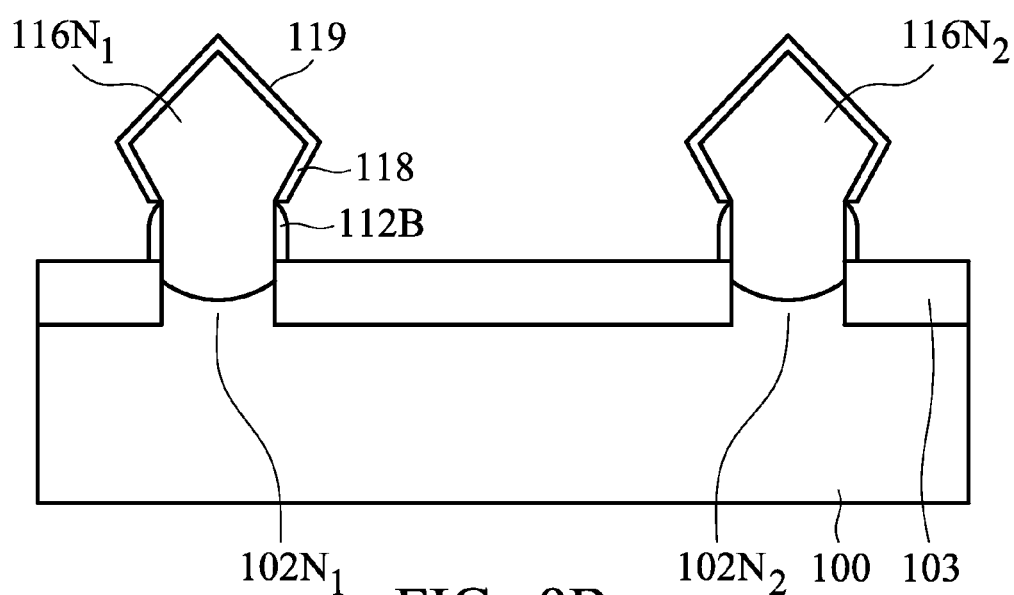

Afterwards, as shown in FIGS. 1F, 9A, and 9B, the mask layer 120 is removed to expose the gate stack 104N and the semiconductor protection layer 118, in accordance with some embodiments. In some embodiments, an etching process is used to remove the mask layer 120. The etching process may include a wet etching process, a dry etching process, or a combination thereof. Due to the semiconductor protection layers 118 and 128, the source/drain structures 116N₁, 116N₂, 126P₁, and 126P₂ are protected without being damaged or without being seriously damaged during the etching process and/or other associated cleaning processes. The performance and reliability of the semiconductor device are improved.

Afterwards, various processes may be performed to finish the formation of the semiconductor device. The processes include, for example, a contact hole formation process, a metal silicidation process, a gate replacement process, another suitable process, or a combination thereof. These processes may involve applying etchants and/or cleaning chemicals over the source/drain structures 116N₁, 116N₂, 126P₁, and 126P₂. In these cases, the semiconductor protection layers 118 and/or 128 are capable of protecting the structures thereunder from being damaged. The performance and reliability of the semiconductor device are improved.

In some embodiments, a portion of the semiconductor protection layers 118 or 128 is thinner than the other portions of the semiconductor protection layers 118 or 128. For example, the portion of the semiconductor protection layers 118 or 128 exposed by contact holes may be thinner. The exposed portion of the semiconductor protection layers 118 or 128 may be damaged or consumed after the etching processes and/or cleaning processes. As a result, some portions of the semiconductor protection layers 118 or 128 may be thinner.

Figure 11:
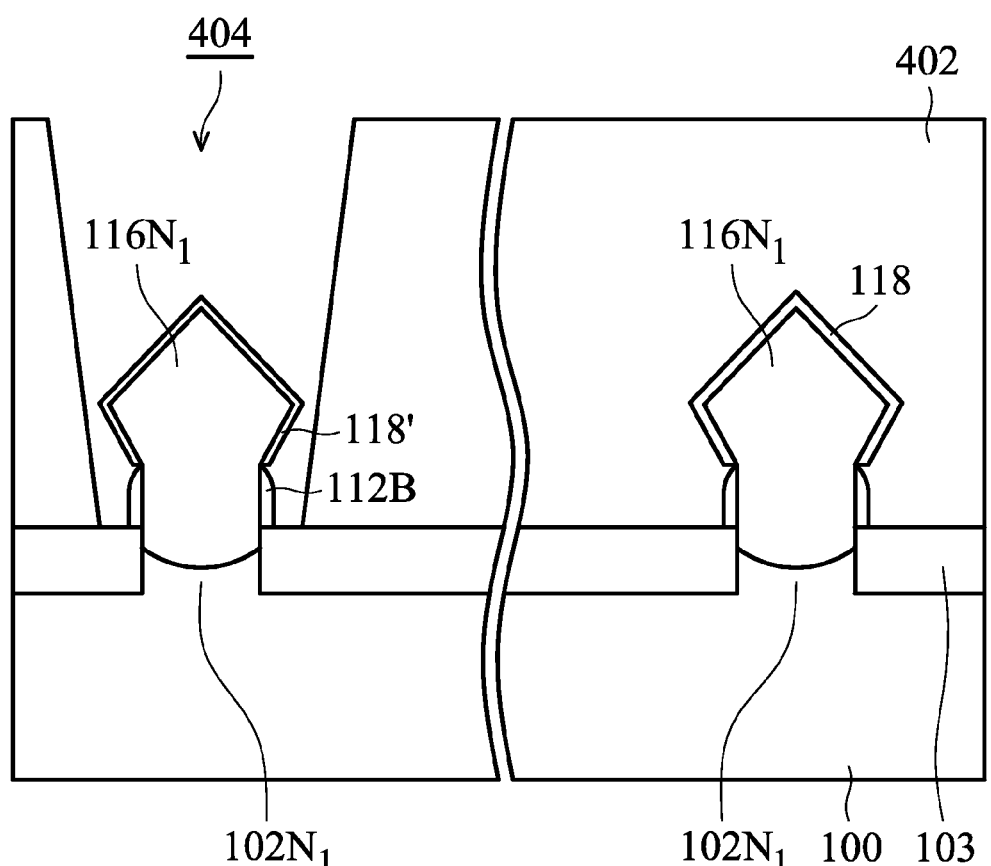
FIG. 11 is a cross-sectional view of a stage of a process for forming a semiconductor device, in accordance with some embodiments.

FIG. 11 is a cross-sectional view of a stage of a process for forming a semiconductor device, in accordance with some embodiments. The structure shown in FIG. 11 may be formed by using the methods described in FIGS. 1A-1F, 2A-9A, and 2B-9B. In some embodiments, a dielectric layer 402 is deposited and patterned to form a contact hole 404. The right side of FIG. 11 shows the portion of the semiconductor protection layer 118 covered by the dielectric layer 402. The left side of FIG. 11 shows the portion of the semiconductor protection layer (which is denoted by reference number 118') exposed by the contact hole 404. In some embodiments, the portion of the semiconductor protection layer 118' is thinner than the portion of the semiconductor protection layer 118 covered by the dielectric layer 402. In these cases, a first portion the semiconductor protection layer 118 or 128 is thinner than a second portion of the semiconductor protection layer 118 or 128. In some embodiments, the first portion is under a contact hole.

However, it should be appreciated that embodiments of the disclosure are not limited to the embodiments mentioned above. In some embodiments, the portion of the semiconductor protection layer 118' exposed by the contact hole 404 has a thickness substantially equal to that of the semiconductor protection layer 118 not exposed by the contact hole 404. In these cases, the etching and/or cleaning processes for forming the contact hole 404 does not substantially damage or consume the exposed semiconductor protection layer 118.

Embodiments of the disclosure provide a structure and formation method of a semiconductor device with a fin structure (or a raised source/drain structure). A semiconductor protection layer is formed over the fin structure. The semiconductor protection layer could be grown in-situ on the fin structure. The semiconductor protection layer includes carbon and has an atomic concentration of carbon greater than that of the underlying fin structure. The semiconductor protection layer can protect the fin structure from being damaged or being seriously damaged during subsequent processes such as etching and/or cleaning processes. Therefore, the performance and reliability of the semiconductor device are improved.

In accordance with some embodiments, a semiconductor device is provided. The semiconductor device includes a semiconductor substrate and a fin structure over the semiconductor substrate. The semiconductor device also includes a gate stack covering a portion of the fin structure and an epitaxially grown source/drain structure over the fin structure and adjacent to the gate stack. The semiconductor device further includes a semiconductor protection layer over the epitaxially grown source/drain structure. The semiconductor protection layer has an atomic concentration of carbon greater than that of the epitaxially grown source/drain structure.

In accordance with some embodiments, a semiconductor device is provided. The semiconductor device includes a semiconductor substrate and a first fin structure over the semiconductor substrate. The semiconductor device also includes a first epitaxially grown source/drain structure over the first fin structure. The semiconductor device further includes a second fin structure over the semiconductor substrate and a second epitaxially grown source/drain structure over the second fin structure. In addition, the semiconductor device includes a first semiconductor protection layer over the first epitaxially grown source/drain structure, and the first semiconductor protection layer has an atomic concentration of carbon greater than that of the first epitaxially grown source/drain structure. The semiconductor device further includes a second semiconductor protection layer over the second epitaxially grown source/drain structure, and the second semiconductor protection layer has an atomic concentration of carbon greater than that of the second epitaxially grown source/drain structure.

In accordance with some embodiments, a method for forming a semiconductor device is provided. The method includes forming a fin structure over a semiconductor substrate and forming a gate stack over the semiconductor substrate and covering a portion of the fin structure. The method also includes epitaxially growing source/drain structures over the fin structure and adjacent to the gate stack. The method further includes forming a semiconductor protection layer over the source/drain structures. The semiconductor protection layer includes carbon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a fin structure over the semiconductor substrate;
   a gate stack covering a portion of the fin structure;
   an epitaxially grown source/drain structure over the fin structure and adjacent to the gate stack; and
   a semiconductor protection layer over the epitaxially grown source/drain structure, wherein the semiconductor protection layer has an atomic concentration of carbon greater than that of the epitaxially grown source/drain structure, and the atomic concentration of carbon in the semiconductor protection layer gradually decreases along a direction from a surface of the semiconductor protection layer towards the epitaxially grown source/drain structure.

2. The semiconductor device structure as claimed in claim 1, wherein the semiconductor protection layer is in direct contact with the epitaxially grown source/drain structure.

3. The semiconductor device structure as claimed in claim 1, wherein the semiconductor protection layer includes silicon and carbon.

4. The semiconductor device structure as claimed in claim 1, wherein the semiconductor protection layer includes silicon, carbon, and germanium.

5. The semiconductor device structure as claimed in claim 1, wherein the atomic concentration of carbon in the semiconductor protection layer is in a range from about 1% to about 10%.

6. The semiconductor device structure as claimed in claim 1, wherein the epitaxially grown source/drain structure is an n-type semiconductor material.

7. The semiconductor device structure as claimed in claim 1, wherein the epitaxially grown source/drain structure is a p-type semiconductor material.

8. The semiconductor device structure as claimed in claim 1, further comprising support elements covering a lower portion of the epitaxially grown source/drain structure, wherein the support elements are in direct contact with the epitaxially grown source/drain structure, and the support elements are between the semiconductor protection layer and the semiconductor substrate.

9. The semiconductor device structure as claimed in claim 1, wherein the semiconductor protection layer has a first portion and a second portion, and the first portion is thinner than the second portion.

10. A semiconductor device structure, comprising:
    a semiconductor substrate;
    a first fin structure over the semiconductor substrate;
    a first epitaxially grown source/drain structure over the first fin structure;
    a second fin structure over the semiconductor substrate;
    a second epitaxially grown source/drain structure over the second fin structure;
    a first semiconductor protection layer over the first epitaxially grown source/drain structure, wherein the first semiconductor protection layer has an atomic concentration of carbon greater than that of the first epitaxially grown source/drain structure, and the atomic concentration of carbon in the first semiconductor protection layer gradually decreases along a direction from a surface of the first semiconductor protection layer towards the first epitaxially grown source/drain structure; and
    a second semiconductor protection layer over the second epitaxially grown source/drain structure, wherein the second semiconductor protection layer has an atomic concentration of carbon greater than that of the second epitaxially grown source/drain structure.

11. The semiconductor device structure as claimed in claim 10, wherein the first semiconductor protection layer and the second semiconductor protection layer are made of different materials.

12. The semiconductor device structure as claimed in claim 10, wherein the atomic concentration of carbon in the first semiconductor protection layer or the second semiconductor protection layer is in a range from about 1% to about 10%.

13. The semiconductor device structure as claimed in claim 10, wherein the first epitaxially grown source/drain structure is an n-type semiconductor material, and the second epitaxially grown source/drain structure is a p-type semiconductor material.

14. A semiconductor device structure, comprising:
a semiconductor substrate;
a fin structure over the semiconductor substrate;
an epitaxially grown source/drain structure over the fin structure; and
a semiconductor protection layer over the epitaxially grown source/drain structure, wherein the semiconductor protection layer contains more carbon than the epitaxially grown source/drain structure, and an atomic concentration of carbon in the semiconductor protection layer gradually decreases along a direction from a surface of the semiconductor protection layer towards the epitaxially grown source/drain structure.

15. The semiconductor device structure as claimed in claim 14, wherein the semiconductor protection layer includes silicon and carbon.

16. The semiconductor device structure as claimed in claim 14, wherein the semiconductor protection layer is in direct contact with the epitaxially grown source/drain structure.

17. The semiconductor device structure as claimed in claim 14, further comprising an isolation feature over the semiconductor substrate, wherein the isolation feature surrounds the fin structure and a lower portion of the epitaxially grown source/drain structure.

18. The semiconductor device structure as claimed in claim 10, further comprising support elements covering a lower portion of the first epitaxially grown source/drain structure, wherein the support elements are in direct contact with the first epitaxially grown source/drain structure, and the support elements are between the first semiconductor protection layer and the semiconductor substrate.

19. The semiconductor device structure as claimed in claim 14, further comprising support elements covering a lower portion of the epitaxially grown source/drain structure, wherein the support elements are in direct contact with the epitaxially grown source/drain structure, and the support elements are between the semiconductor protection layer and the semiconductor substrate.

20. The semiconductor device structure as claimed in claim 19, wherein each of the support elements has an upper portion and a lower portion, and the lower portion is thicker than the upper portion.

* * * * *